US010211092B1

(12) United States Patent
Cheng et al.

(10) Patent No.: US 10,211,092 B1
(45) Date of Patent: Feb. 19, 2019

(54) TRANSISTOR WITH ROBUST AIR SPACER

(71) Applicant: International Business Machines Corporation, Armonk, NY (US)

(72) Inventors: Kangguo Cheng, Schenectady, NY (US); Chanro Park, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/881,778

(22) Filed: Jan. 28, 2018

(51) Int. Cl.
| | |
|---|---|
| *H01L 29/78* | (2006.01) |
| *H01L 21/768* | (2006.01) |
| *H01L 29/417* | (2006.01) |
| *H01L 21/311* | (2006.01) |
| *H01L 29/66* | (2006.01) |
| *H01L 27/088* | (2006.01) |
| *H01L 21/8234* | (2006.01) |

(52) U.S. Cl.
CPC ...... *H01L 21/7682* (2013.01); *H01L 21/7688* (2013.01); *H01L 21/76831* (2013.01); *H01L 21/76834* (2013.01); *H01L 29/41775* (2013.01); *H01L 29/6653* (2013.01); *H01L 21/31111* (2013.01); *H01L 21/31116* (2013.01); *H01L 21/823431* (2013.01); *H01L 27/0886* (2013.01); *H01L 29/66795* (2013.01); *H01L 29/66803* (2013.01); *H01L 29/785* (2013.01)

(58) Field of Classification Search
CPC ............. H01L 29/66803; H01L 29/785; H01L 21/823431; H01L 27/0886
USPC ......................................... 257/288; 438/283
See application file for complete search history.

(56) References Cited

U.S. PATENT DOCUMENTS

| 8,513,067 B2 | 8/2013 | Huang et al. |
| 9,305,835 B2 | 4/2016 | Alptekin et al. |
| 9,443,982 B1 | 9/2016 | Balakrishnan |
| (Continued) | | |

FOREIGN PATENT DOCUMENTS

WO     2017111770 A1     6/2017

OTHER PUBLICATIONS

Cheng, K., Park, C., Yeung, C., et al. (2016). Air spacer for 10nm FinFET CMOS and beyond. In Electron Devices Meeting (IEDM), 2016 IEEE International, 17-1.

(Continued)

*Primary Examiner* — George Fourson, III
(74) *Attorney, Agent, or Firm* — Garg Law Firm, PLLC; Rakesh Garg; David M. Quinn

(57) ABSTRACT

Fabricating a transistor includes receiving a semiconductor structure including a source/drain, a gate, and a spacer disposed between the source/drain and the gate, a trench contact disposed on the source/drain, a self-aligned cap disposed on the gate, and an interlevel dielectric layer disposed on the spacer, self-aligned cap, and trench contact. A source/drain contact is formed within the interlevel dielectric layer in contact with the trench contact and forming a gate contact in contact with the gate. The interlevel dielectric layer is removed from the spacer, self-aligned cap, and source/drain contact. The self-aligned cap and the spacer is selectively etched. A dielectric liner of a first dielectric material is deposited upon a top of the gate, the trench contact and the S/D contact. The first dielectric material of the dielectric liner pinches off a gap between the gate and the trench contact to form an air spacer therebetween.

20 Claims, 13 Drawing Sheets

(56) References Cited

U.S. PATENT DOCUMENTS

| | | | |
|---|---|---|---|
| 9,515,156 | B2 | 12/2016 | Besser et al. |
| 9,536,982 | B1* | 1/2017 | Cheng ............... H01L 29/41791 |
| 9,608,065 | B1* | 3/2017 | Bergendahl ......... H01L 27/0886 |
| 9,589,833 | B1 | 5/2017 | Cheng et al. |
| 10,026,824 | B1* | 7/2018 | Chanemougame ......................... H01L 29/4991 |
| 2013/0017654 | A1 | 1/2013 | Huang et al. |
| 2014/0217520 | A1 | 8/2014 | Niebojewski et al. |
| 2015/0091089 | A1 | 4/2015 | Niebojewski et al. |
| 2015/0243544 | A1 | 8/2015 | Alptekin et al. |
| 2017/0141207 | A1 | 5/2017 | Chang et al. |
| 2017/0162650 | A1* | 6/2017 | Cheng ................. H01L 29/0649 |
| 2017/0243968 | A1* | 8/2017 | Cheng ................. H01L 29/4991 |
| 2018/0033863 | A1* | 2/2018 | Xie .................... H01L 29/66795 |
| 2018/0122919 | A1* | 5/2018 | Park .................. H01L 29/66545 |
| 2018/0166319 | A1* | 6/2018 | Park .................... H01L 21/7682 |

OTHER PUBLICATIONS

Dey, S. (2006). Fabrication modeling and reliability of novel architecture and novel materials based MOSFET devices. (Doctoral dissertation).

* cited by examiner

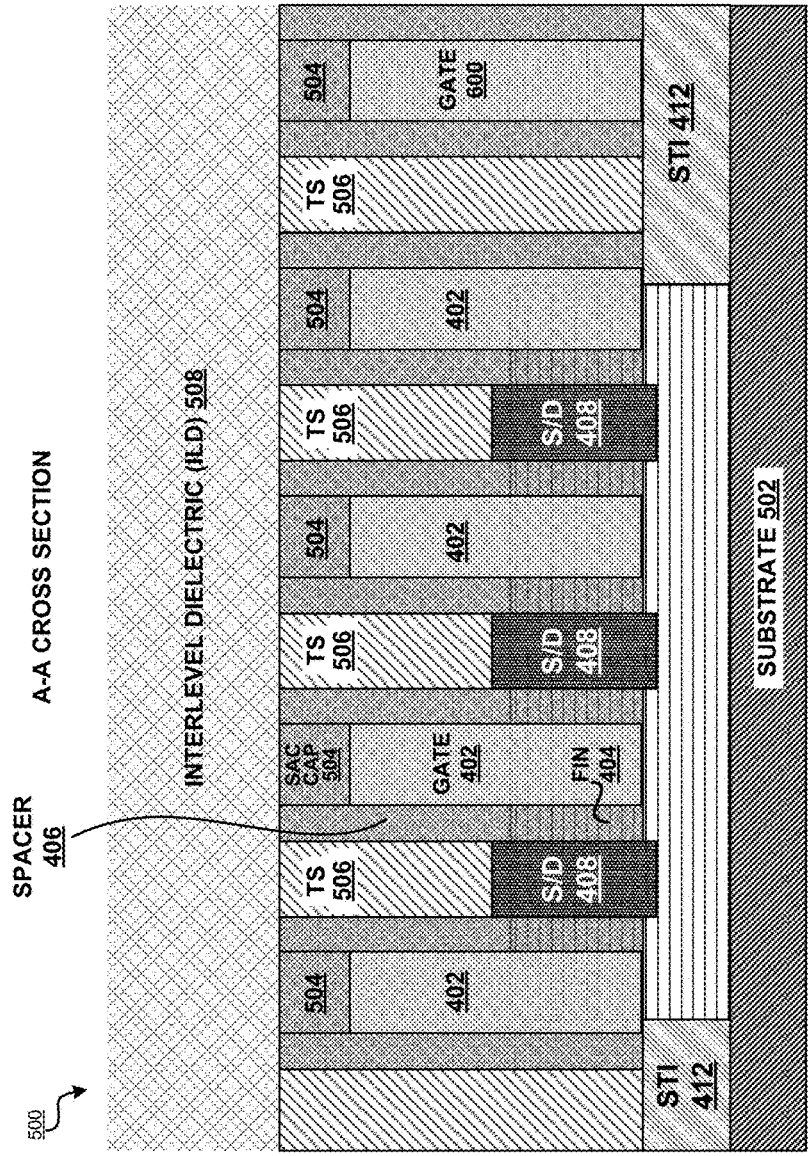

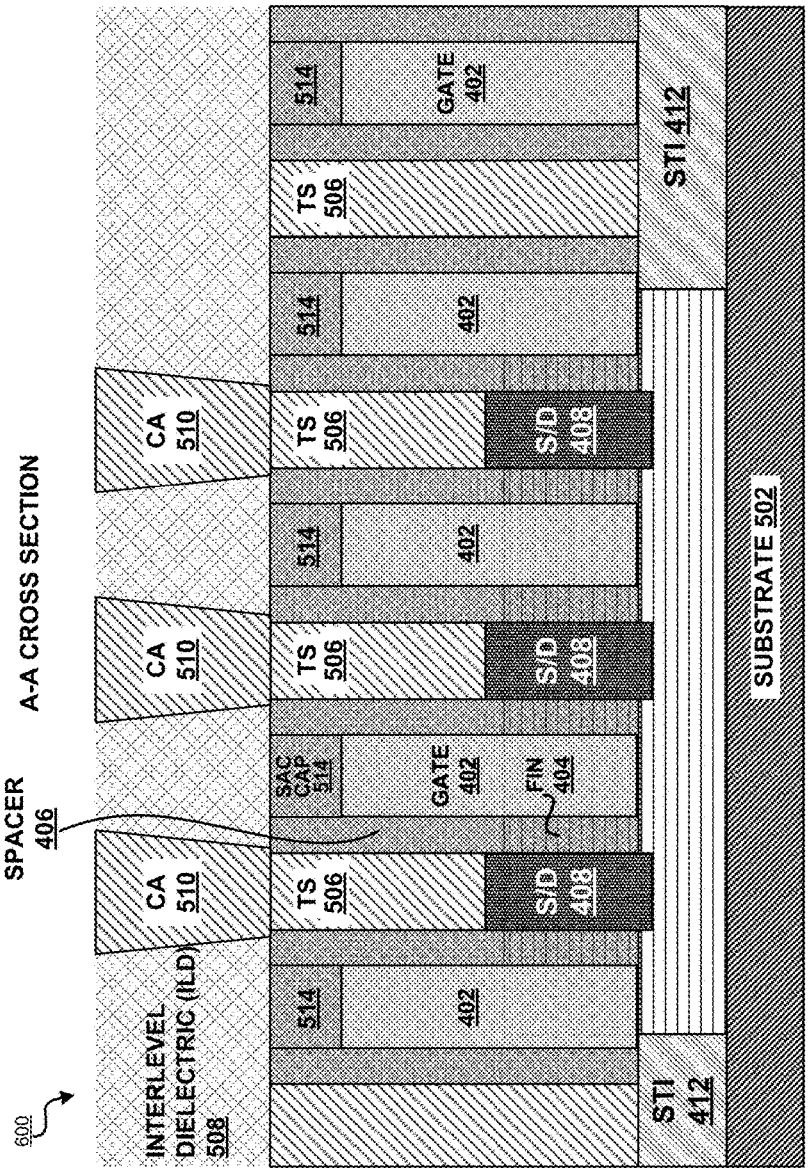

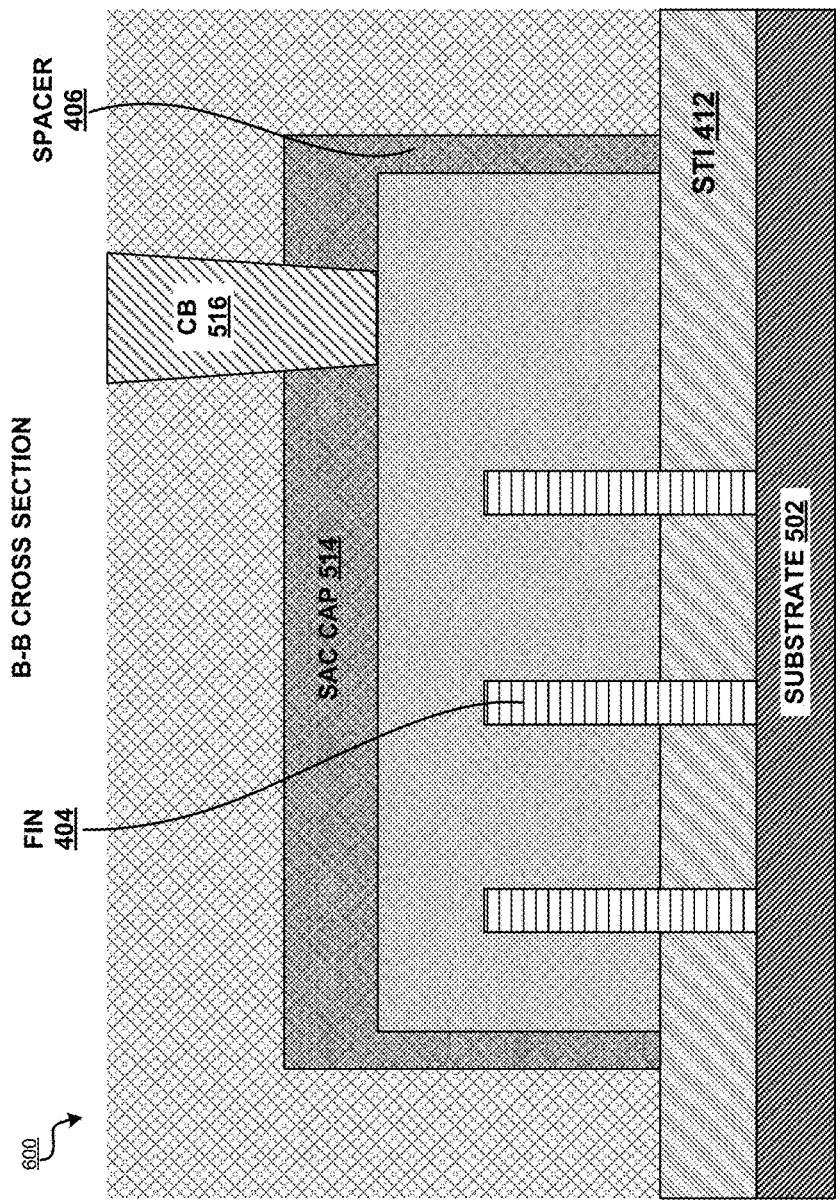

A-A CROSS SECTION

A-A CROSS SECTION

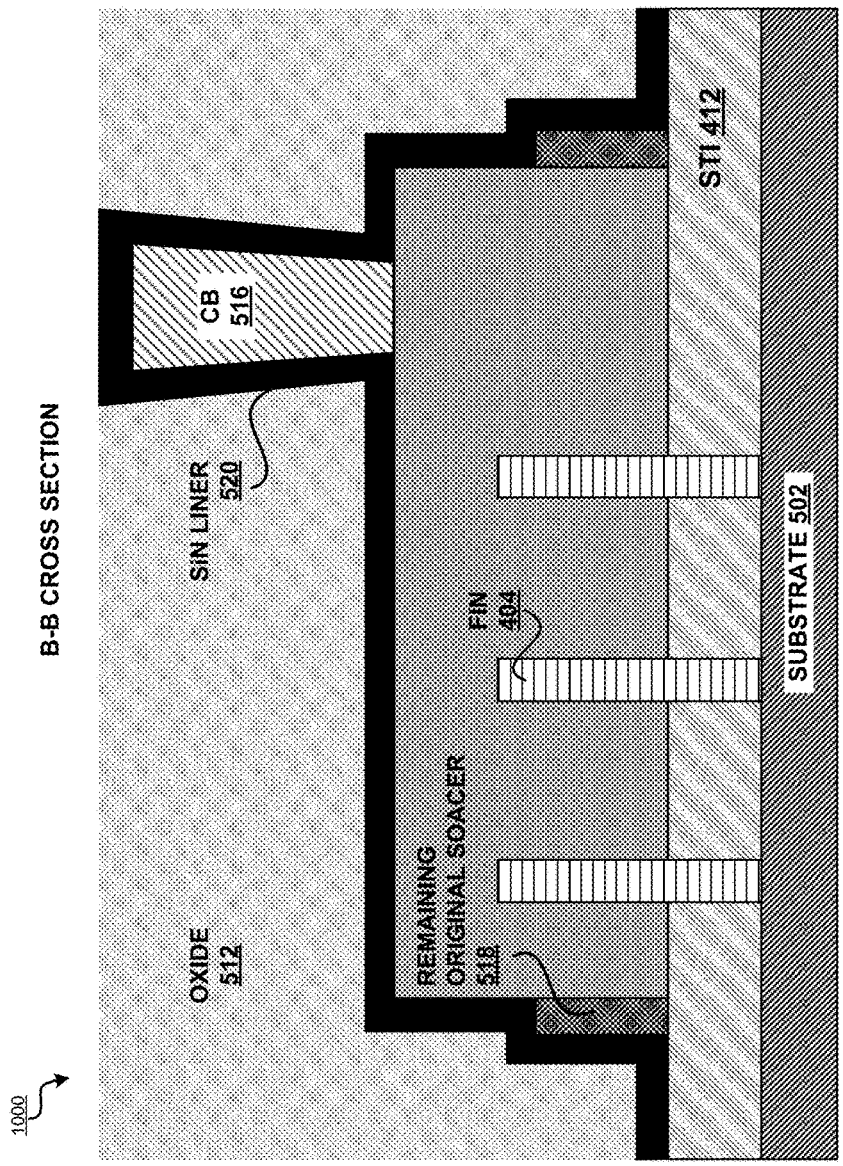

TRANSISTOR WITH ROBUST AIR SPACER

TECHNICAL FIELD

The present invention relates generally to a method for fabricating a transistor and a structure formed by the method. More particularly, the present invention relates to a method for fabricating a transistor with a robust air spacer and a structure formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A fin-Field Effect Transistor (finFET) is a non-planar device in which a source and a drain are connected using a fin-shaped conducting channel (fin). Generally, a finFET is fabricated as a multi-gate device in which two or more gates are coupled using one or more fin structures.

SUMMARY

The illustrative embodiments provide a method and apparatus. An embodiment of a method of fabricating a transistor includes receiving a semiconductor structure, the semiconductor structure including a source/drain, a gate, and a spacer disposed between the source/drain and the gate, the semiconductor structure further including a trench contact disposed on the source/drain and a self-aligned cap disposed on the gate, the semiconductor structure further including an interlevel dielectric layer disposed on the spacer, self-aligned cap, and trench contact. The embodiment further includes forming a source/drain contact within the interlevel dielectric layer in contact with the trench contact and forming a gate contact within the interlevel dielectric layer in contact with the gate. The embodiment further includes removing the interlevel dielectric layer from the spacer, self-aligned cap, and source/drain contact. The embodiment further includes selectively etching the self-aligned cap and the spacer. The embodiment further includes depositing a dielectric liner of a first dielectric material upon a top of the gate, the trench contact and the S/D contact, the first dielectric material of the dielectric liner pinching off a gap between the gate and the trench contact to form an air spacer therebetween.

An embodiment further includes depositing a second dielectric material upon the dielectric liner. In an embodiment, the second dielectric material includes an oxide. In an embodiment, the second dielectric material includes a low dielectric constant (low-K) material.

In an embodiment, the selective etching of the self-aligned cap includes substantially removing the self-aligned cap. In an embodiment, the selective etching of the spacer includes removing a portion of the spacer.

In an embodiment, the first dielectric material includes a non-conformal dielectric material. In an embodiment, the first dielectric material includes silicon nitride.

In an embodiment, forming the source/drain contact within the interlevel dielectric layer further includes forming a contact trench in the interlevel dielectric layer and depositing a conductive material in the contract trench. An embodiment further includes planarizing the source/drain contract.

In an embodiment, removing the interlevel dielectric layer includes etching the interlevel dielectric layer. In an embodiment, etching the interlevel dielectric layer includes a wet etching process.

An embodiment of an apparatus includes a source/drain, a gate, a trench contact disposed on the source/drain, a source/drain contact in contact with the trench contact, and a gate contact in contact with the gate. The embodiment further includes a dielectric liner of a first dielectric material deposited upon a top of the gate, the trench contact and the S/D contact. In the embodiment, the first dielectric material of the dielectric liner forms an air spacer between the gate and the trench contact.

An embodiment includes a computer usable program product. The computer usable program product includes one or more computer-readable storage devices, and program instructions stored on at least one of the one or more storage devices.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 5 depicts a first cross section view of a portion of a process in which a structure is received by the fabrication system according to an embodiment;

FIGS. 6A-6B depict cross-section views of another portion of a process in which a structure is formed according to an embodiment;

FIGS. 10A-10B depict cross-section views of another portion of a process in which structure 1000 is formed according to an embodiment.

DETAILED DESCRIPTION

Figure 1:
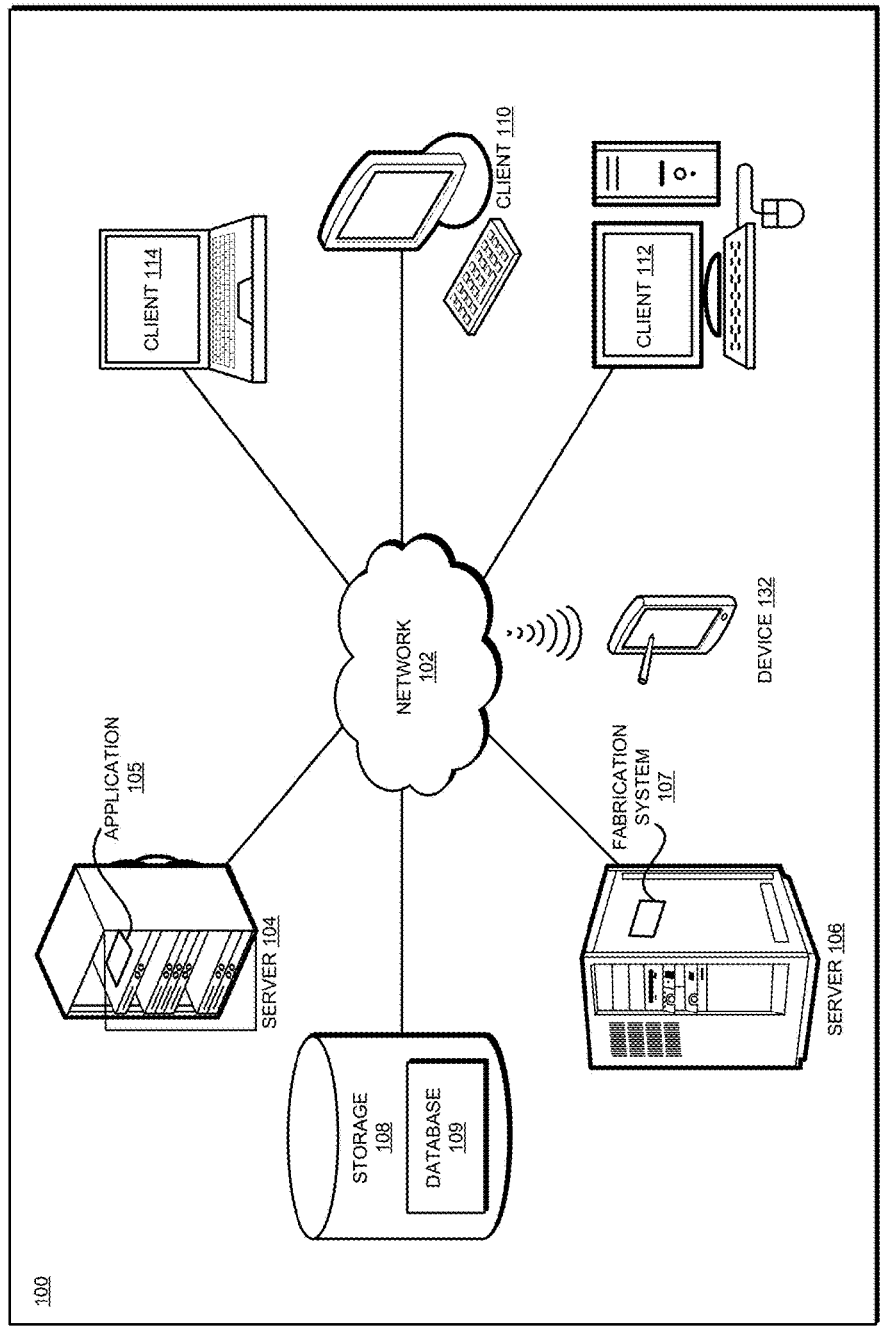
FIG. 1 depicts a block diagram of a network of data processing systems in which illustrative embodiments may be implemented.

The illustrative embodiments relate to a method for fabricating transistors with a robust air spacer and a structure formed by the method. The illustrative embodiments recognize that the present methods and techniques for fabricating transistors with air spacers suffer from several problems. An air spacer is very useful to reduce parasitic capacitance for highly scaled metal-oxide-semiconductor (MOS) transistors. Conventionally, when a gate contact is formed after an air spacer, the gate contact etch may undesirably enter the open air spacer. During gate contact metal deposition, metal material may enter the air spacer, resulting in potential shorting and decreased reliability. A mask could be used to block the formation of air spacer in the gate contact region, but additional mask and associated pattern matching processes unfavorably increases process cost and complexity. Various embodiments described herein provide for a method and structure for forming transistors, such as a MOSFET transistor, with air spacers that are not subject to the above described problems encountered during conventional fabrication of transistors having air spacers.

In one or more embodiments, air spacers are formed after the formation of both source/drain contacts (CA) and gate contacts (CB). In one or more embodiments, after source/drain contact (CA) and gate contact (CB) formation on a semiconductor structure are performed, an interlevel dielectric (ILD), a gate cap, and spacers are removed from the semiconductor structure. In the embodiment, a non-conformal dielectric, such as plasma-enhanced chemical vapor deposition (PECVD) nitride is then deposited to pinch off resulting in formation of air spacers. In the embodiment, the rest of the opening area of semiconductor structure is filled by another dielectric such as a flowable oxide. Various embodiments of the process flow described herein are agnostic to the particular middle-of-line (MOL) scheme used during fabrication. In addition, one or more embodiments, are compatible with CB-over-active (CB-over-RX) or contact over active gate (COAG) transistor fabrication processes.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate transistors having robust air spacers.

For the clarity of the description, and without implying any limitation thereto, the illustrative embodiments are described using a finFET transistor disposed on a substrate. An embodiment can be implemented with different types and/or numbers of transistors, a number of gates, and/or a different number of substrates within the scope of the illustrative embodiments.

Furthermore, a simplified diagram of the example finFETs are used in the figures and the illustrative embodiments. In an actual fabrication of transistors, additional structures that are not shown or described herein may be present without departing the scope of the illustrative embodiments. Similarly, within the scope of the illustrative embodiments, a shown or described structure in the example transistors may be fabricated differently to yield a similar operation or result as described herein.

Differently shaded portions in the two-dimensional drawing of the example transistors are intended to represent different structures in the example transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating transistors according to the illustrative embodiments.

Furthermore, the illustrative embodiments are described with respect to transistors only as an example. The steps described by the various illustrative embodiments can be adapted for fabricating other planar and non-planar devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating transistor devices. An embodiment provides a method for fabricating transistors.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments.

Furthermore, a particular illustrative embodiment may have some, all, or none of the advantages listed above.

Figure 2:
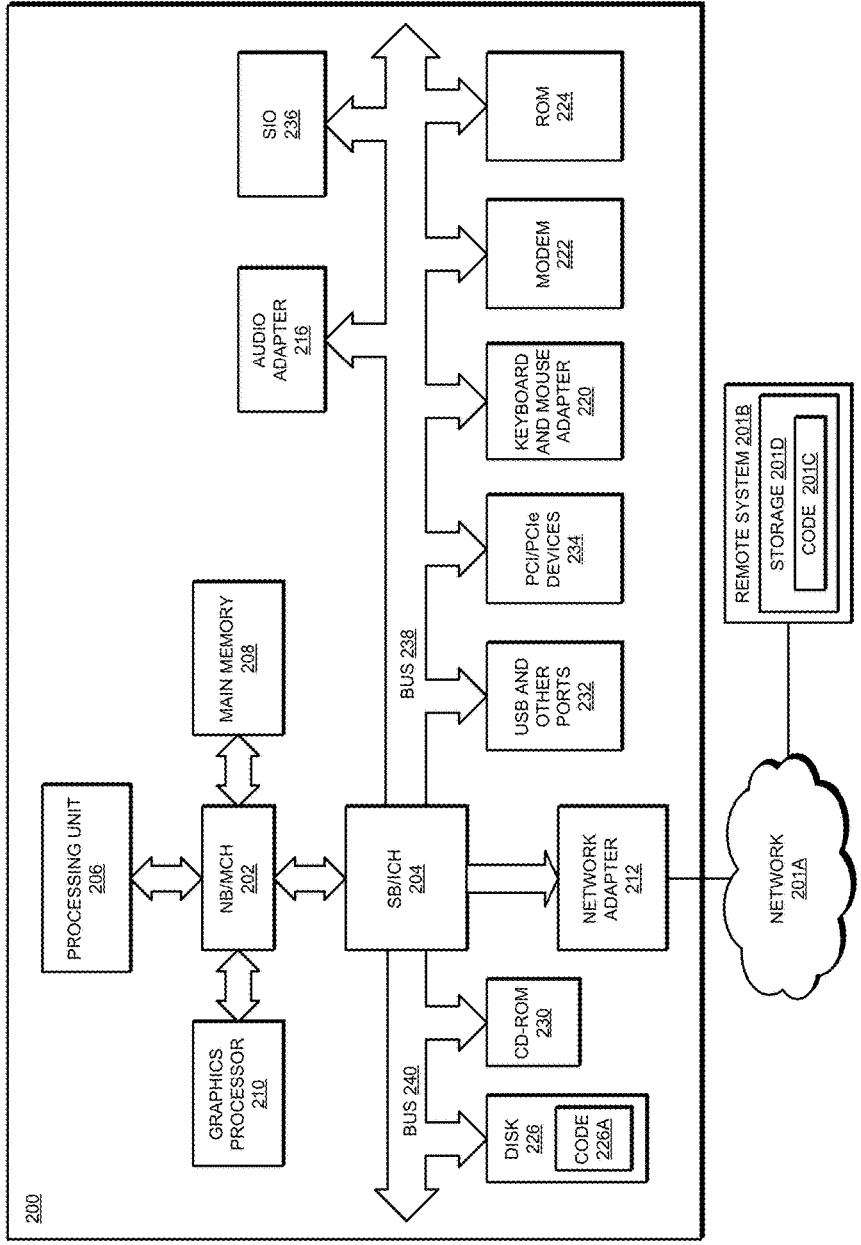
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
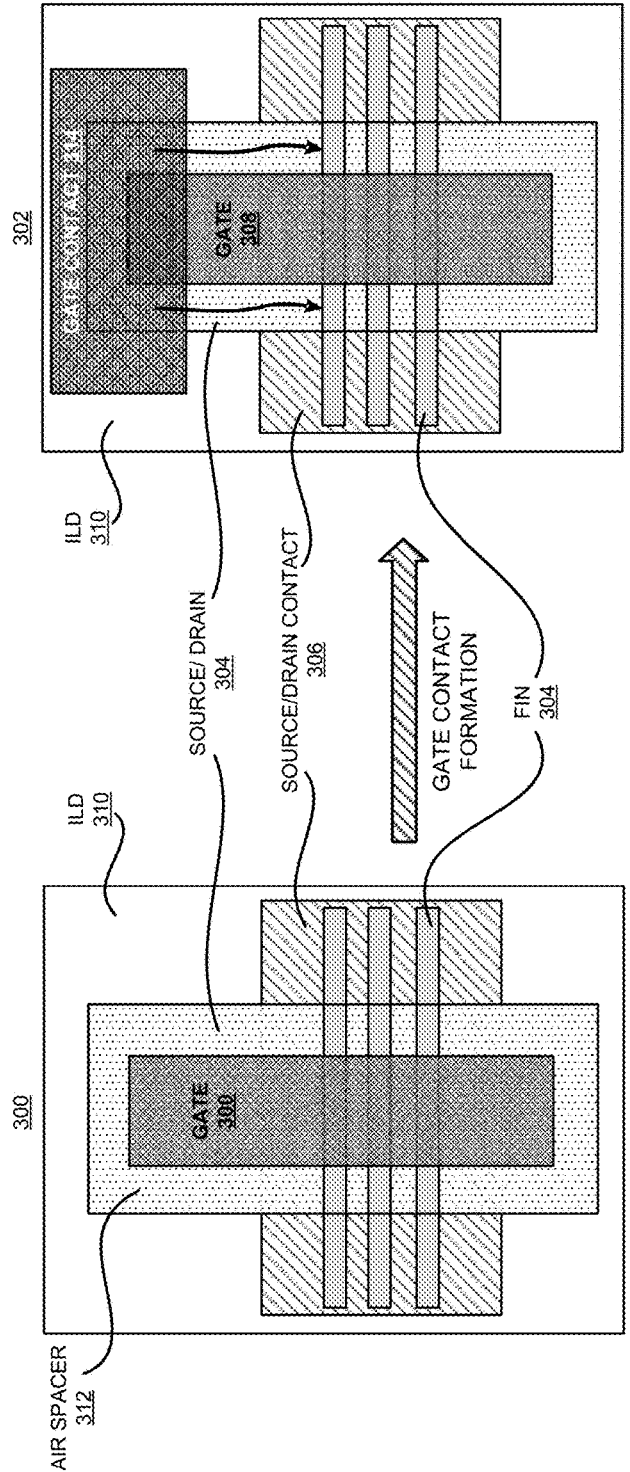
FIG. 3 depicts a top down view of portion of a conventional process for fabricating a transistor device with an air spacer.

With reference to FIG. 3, this figure depicts a top down view of portion of a conventional process for fabricating a transistor device with an air spacer. Semiconductor structure 300 is shown after an air spacer formation fabrication stage. Semiconductor structure 302 is shown after a gate contact etch and metal fill fabrication stage. Semiconductor structure 302 includes a source/drain (S/D) 304, a source/drain (S/D) contact 306, a number of fins 307, a gate 308, an inter-level dielectric (ILD) layer 310, and an air spacer 312 disposed between gate 308 and S/D 304/ILD layer 310. In practice, ILD layer 310 covers source/drain 304. For clarity of illustration, ILD layer 310 above source/drain 304 is omitted from FIG. 3 in order that source/drain 304 is visible. After gate contact formation, semiconductor structure 302 includes a conductive gate contact 314 disposed on a portion of gate 308. As shown in FIG. 3, conductive material from formation of gate contact 314 may undesirably enter air spacer 312 which may lead to potential electrical shorting and/or reliability issues.

With reference to FIGS. 4-10B, these figures depict portions of an example process for fabricating transistors with a robust air spacer in accordance with one or more illustrative embodiments. In the particular embodiments illustrated in FIGS. 4-10B, a single finFET are fabricated upon a substrate and/or wafer. It should be understood that in other embodiments, any combination of transistors or other combinations of any numbers of semiconductor devices, may be fabricated on a substrate in a similar manner.

Figure 4:
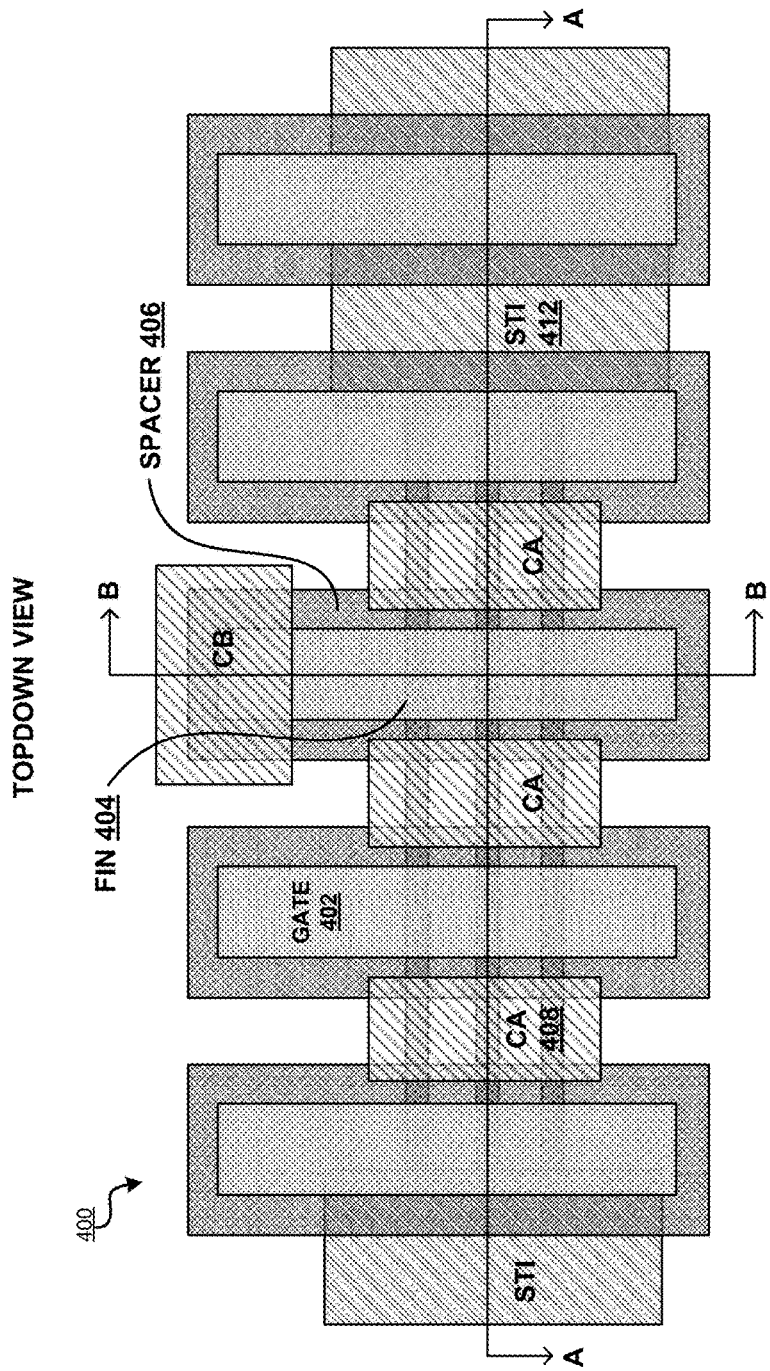
FIG. 4 depicts a top down view of an example semiconductor structure according to an illustrative embodiment.

With reference to FIG. 4, this figure depicts a top down view of an example semiconductor structure 400 according to an illustrative embodiment. Semiconductor structure 400 includes one or more gates 402, one or more fins 404, one or more spacers 406, one or more S/D (CA) contacts 408, and one or more gate contacts (CB) 410 on a substrate (not shown). Semiconductor structure 400 further includes shallow trench isolation (STI) 412. FIG. 4 further illustrates a first dividing line (A-A) for a first cross section view, and a second dividing line (B-B) for a second cross section view of semiconductor structure 400 as will be further described herein.

With reference to FIG. 5, this figure depicts a first cross-section view of a portion of a process in which a structure 500 is received by fabrication system 107 according to an embodiment. In the embodiment, structure 500 is a finFET structure that includes a substrate 502, fins 404, STI 412, gates 402, S/Ds 408, spacers 406, self-aligned gate caps (SAC caps) 504, trench contacts (TS) 506, and an ILD layer 508. STI 412 and each of fins 404 are disposed on a surface of substrate 502. Each trench contact (TS) 506 is disposed upon a corresponding S/D 408. Each SAC cap 504 is disposed upon a corresponding gate 402. Spacers 406 are disposed between gate 402 and an adjacent TS 506 and S/D 408. ILD layer 508 is disposed upon an upper surface of SAC caps 504, trench contacts (TS) 506, and spacers 406. In a particular embodiment, gates 402 are formed of high dielectric coefficient (high-k) dielectric material/metal material. In one or more embodiments, the components of structure 500 are fabricated according to conventional fabrication processes.

With reference to FIGS. 6A-6B, these figures depict cross-section views of another portion of a process in which structure 600 is formed according to an embodiment. FIG. 6A depicts a first cross section view of structure 600 along an A-A cross section. FIG. 6B depicts a second cross section view of structure 600 along a B-B cross section. In the embodiment, fabrication system 107 forms a source/drain contacts (CA) 510 in contact with each trench contact (TS) 506, and forms a gate contact (CB) 516 in contact with gate 402. In particular embodiments, S/D contacts (CA) 510 and gate contact (CB) 516 are formed by patterning to form contact trenches or vias in ILD layer 508, and filling the contact trenches/vias with conductive material. In particular embodiments, the conductive material may include tungsten or cobalt with a titanium nitride liner. In an alternative embodiment, S/D contacts (CA) 510 and trench contacts (TS) 506 are patterned and formed at the same time. In an embodiment, fabrication system 107 planarizes the ILD layer 508 and S/D contacts (CA) 510 by a planarization process to remove conductive materials above ILD layer 508.

Figure 7:
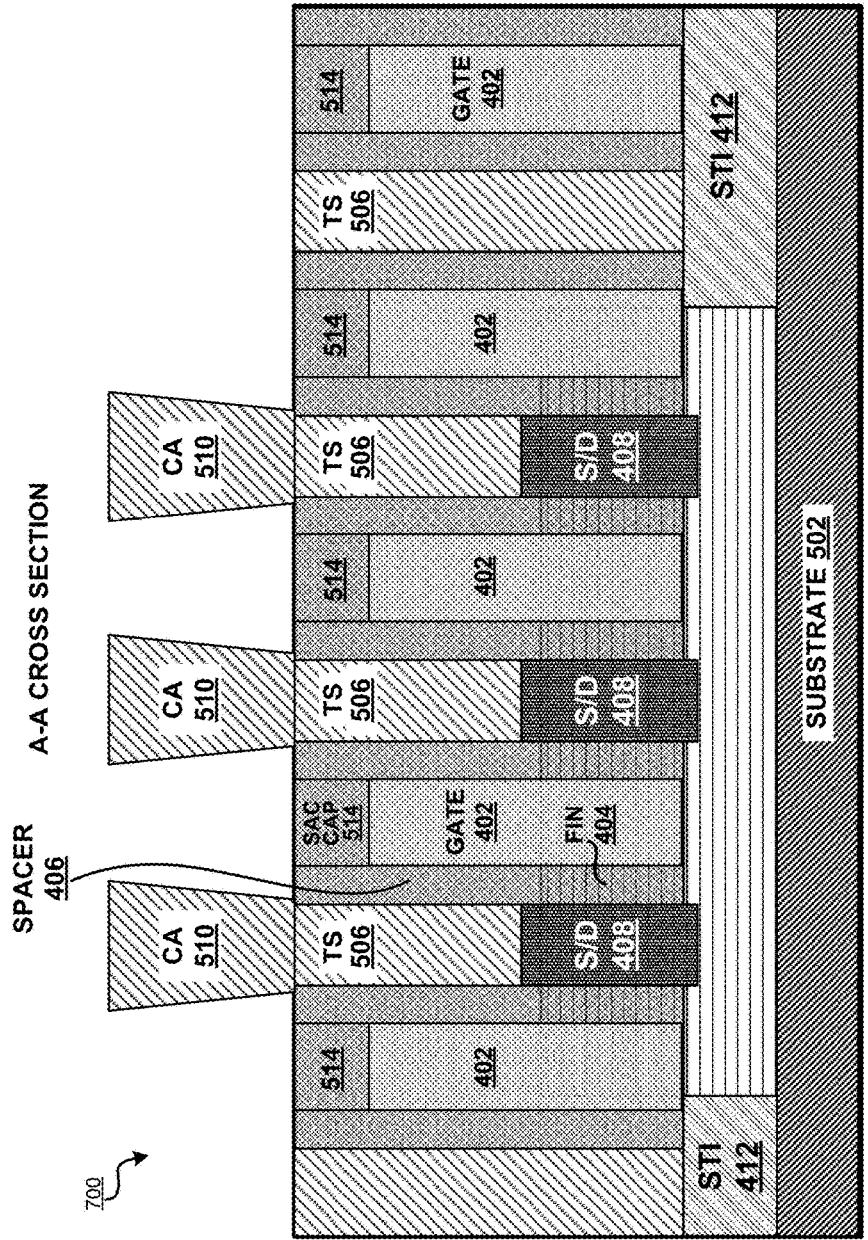
FIG. 7 depicts a cross-section view of another portion of a process in which a structure is formed according to an embodiment.

With reference to FIG. 7, this figure depicts a cross-section view of another portion of a process in which structure 700 is formed according to an embodiment. In the embodiment, fabrication system 107 removes ILD layer 508 from the semiconductor structure. In one or more embodiments, ILD layer 508 is removed by etching the ILD layer 508 by an etching process selective to the ILD material. In a particular embodiment, the etching process Includes a wet etching process. In another particular embodiment, the etching process includes a plasma oxide etch. In other embodiments, any other suitable removal process selective to the ILD material may be used to remove ILD layer 508.

Figure 8:
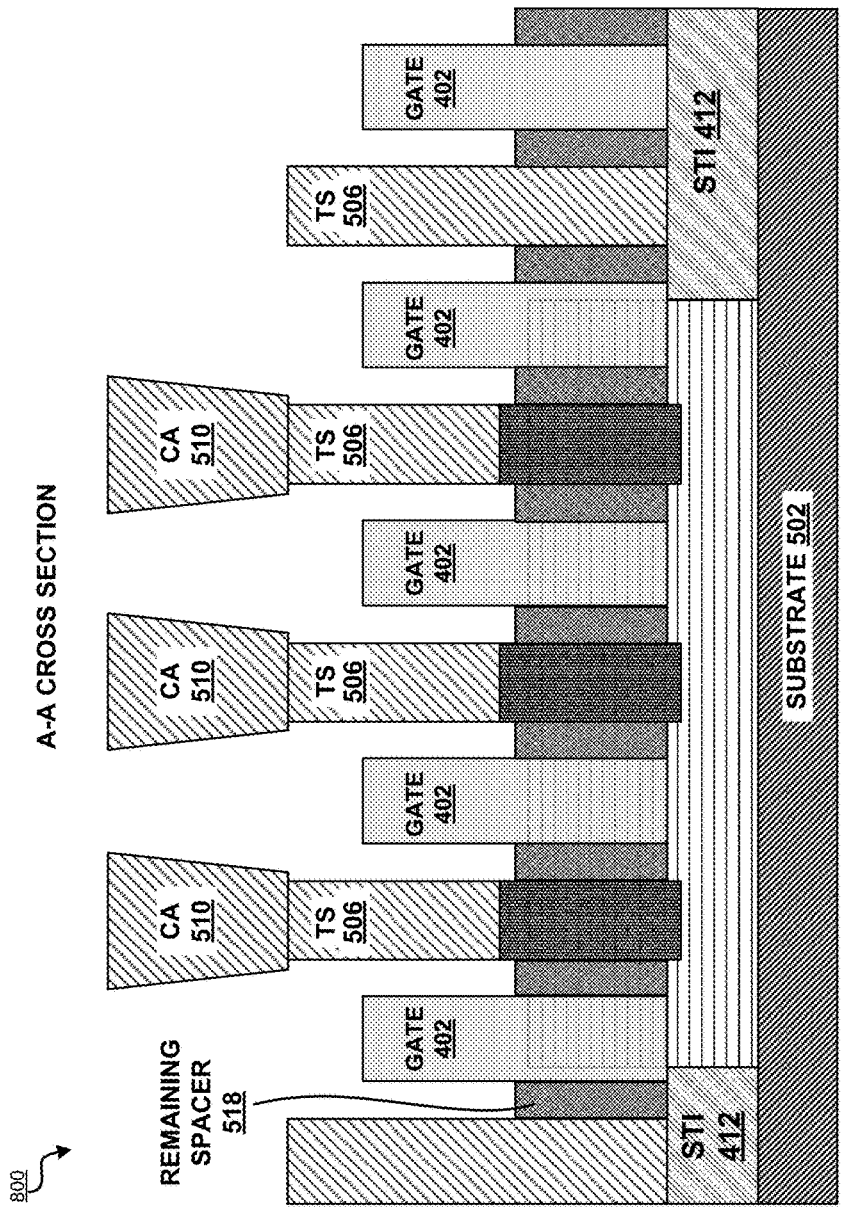
FIG. 8 depicts a cross-section view of another portion of a process in which a structure is formed according to an embodiment.

With reference to FIG. 8, this figure depicts a cross-section view of another portion of a process in which structure 800 is formed according to an embodiment. In the embodiment, fabrication system 107 selectively etches SAC caps 514 and spacers 406 to substantially remove SAC caps 514 and remove at least a portion of spacers 406. In one or more embodiments, spacers 406 are pulled down partially (e.g., above fin top) during etching to minimize spacer pulldown on the gate stack to form a remaining spacer 518. In an alternative embodiment, entire spacers 406 may be pulled down.

Figure 9:
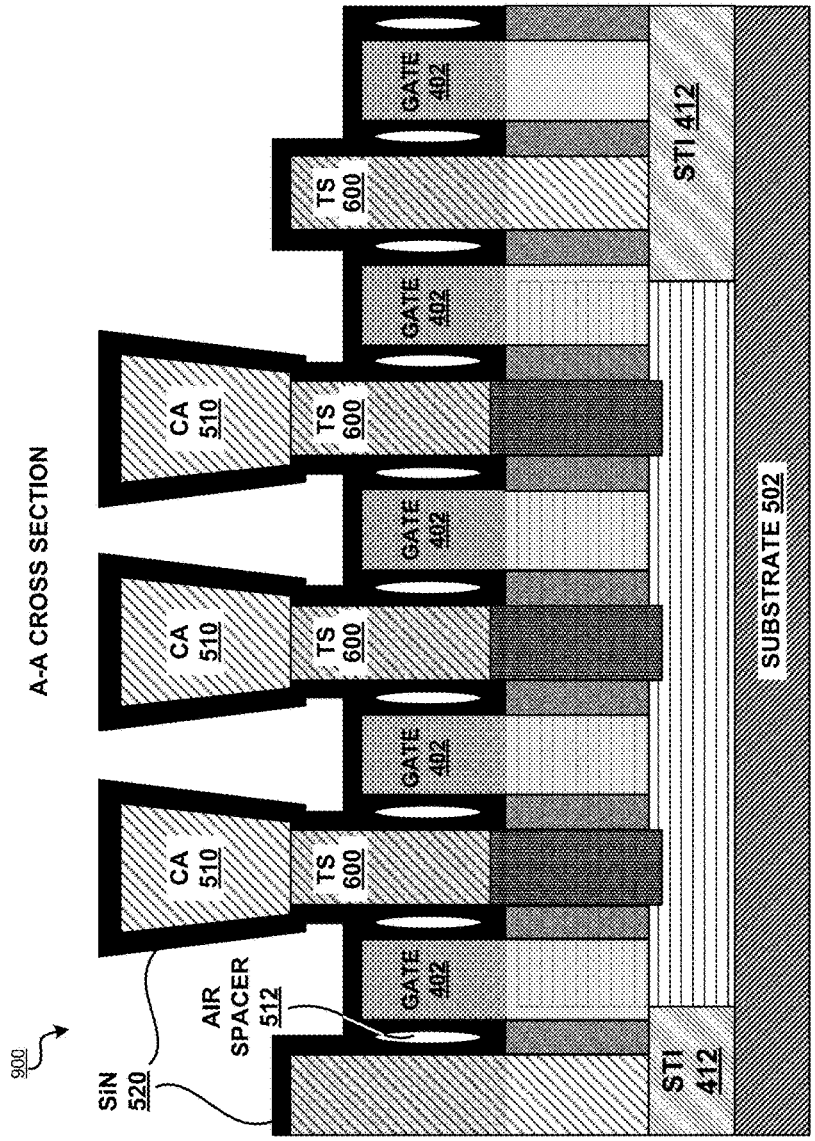
FIG. 9 depicts a cross-section view of another portion of a process in which a structure is formed according to an embodiment.

With reference to FIG. 9, this figure depicts a cross-section view of another portion of a process in which structure 900 is formed according to an embodiment. In the embodiment, fabrication system 107 deposits a non-conformal dielectric liner 520, such as a PECVD nitride) to cover gates 402, spacers 406, trench contacts (TS) 506, S/D contacts 510, and gate contact 516. In a particular embodiment, dielectric liner 520 is formed of silicon nitride (SiN). During deposition of dielectric liner 520, the dielectric material pinches off the gap between gate 402 and trench contact (TS) 506 to form an air spacer 522 over original spacer 518. During the deposition process, dielectric liner 520 is also deposited upon the top of gate 402 to function as a gate cap.

Figure 10A:
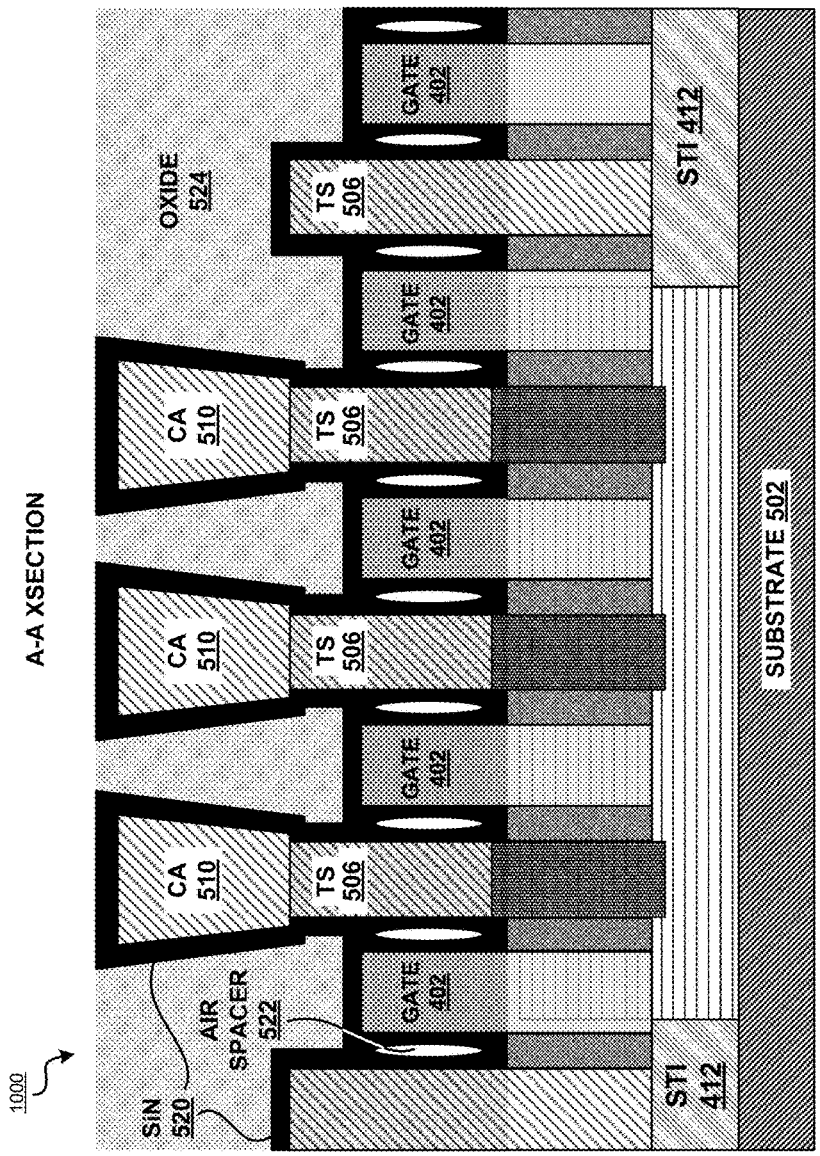

With reference to FIGS. 10A-10B, these figures depict cross-section views of another portion of a process in which structure 1000 is formed according to an embodiment. FIG. 10A depicts a first cross section view of structure 1000 along an A-A cross section. FIG. 10B depicts a second cross section view of structure 1000 along a B-B cross section. In the embodiment, fabrication system 107 fills gaps in the semiconductor structure with a dielectric material 524, such as a flowable oxide or low dielectric constant (low-k) dielectric material, to the top of the dielectric liner 520 upon S/D contacts (CA) 510. In the embodiment, fabrication system 107 further planarizes the dielectric material 524 to polish the surface of dielectric material 524. As a result an transistor structure having a robust air spacer is fabricated and ready for back end of line (BEOL) operations in which individual transistors are interconnected with wiring to produce a completed semiconductor device.

Figure 11:
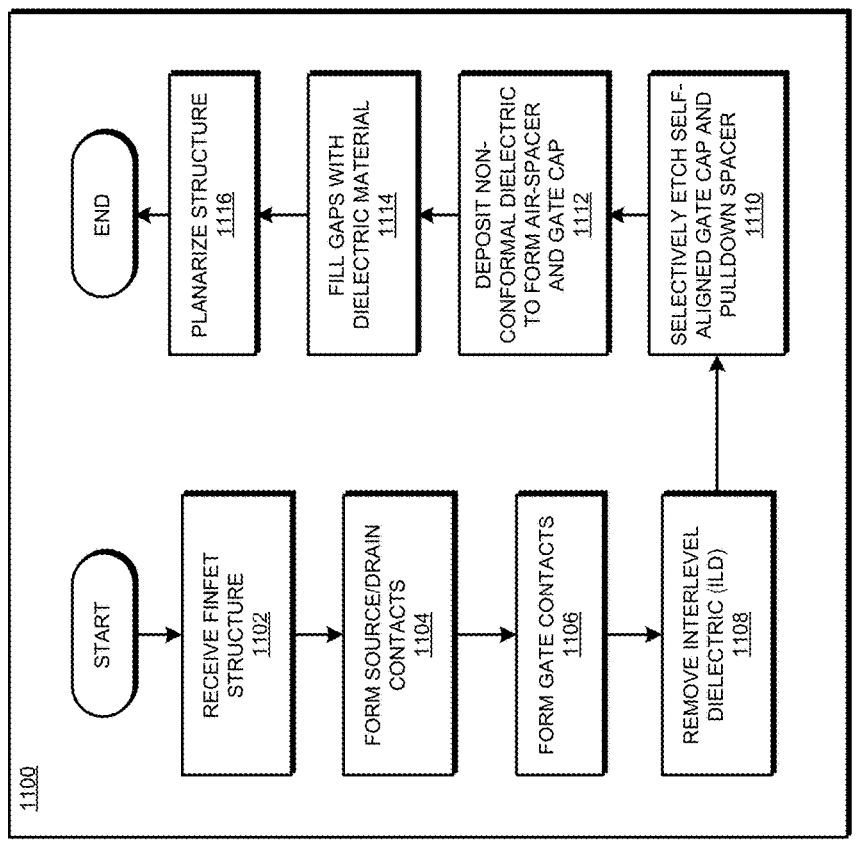
FIG. 11 depicts a flowchart of an example process for fabricating a transistor with a robust air spacer in accordance with an illustrative embodiment.

With reference to FIG. 11, FIG. 11 depicts a flowchart of an example process 1100 for fabricating a transistor with a robust air spacer in accordance with one or more illustrative embodiments. Process 1100 can be implemented in fabrication system 107 in FIG. 1, to perform one or more steps of FIGS. 5-10 as needed in process 1100.

In block 1102, fabrication system 107 receives a finFET structure including substrate 502, at least one fin 404, STI 412, at least one gate 402, at least one S/D 408, at least one spacer 406, at least one self-aligned gate cap (SAC cap) 504, at least one trench contact (TS) 506, and ILD layer 508. In block 1104, fabrication system 107 forms source/drain contacts (CA) 510 in contact with each trench contact (TS) 506. In block 1106, fabrication system 107 forms a gate contact (CB) 516 in contact with gate 402. In particular embodiments, S/D contacts (CA) 510 and gate contact (CB) 516 are formed by patterning to form contact trenches or vias in ILD layer 508, and filling the contact trenches/vias with conductive material. In particular embodiments, the conductive material may include tungsten or cobalt with a titanium nitride liner. In an alternative embodiment, S/D contacts (CA) 510 and trench contacts (TS) 506 are patterned and formed at the same time. In an embodiment, fabrication system 107 planarizes the ILD layer 508 and S/D contacts (CA) 510 by a planarization process to remove conductive materials above ILD layer 508.

In block 1108, fabrication system 107 removes ILD layer 508 from the semiconductor structure. In one or more embodiments, ILD layer 508 is removed by etching the ILD layer 508 by an etching process selective to the ILD dielectric material. In a particular embodiment, the etching process includes a wet etching process. In another particular embodiment, the etching process includes a plasma oxide etch. In other embodiments, any other suitable removal process selective to the ILD material may be used to remove ILD layer 508.

In block 1110, fabrication system 107 selectively etches SAC caps 514 and spacers 406 to substantially remove SAC caps 514 and remove at least a portion of spacers 406. In one or more embodiments, spacers 406 are pulled down partially (e.g., above fin top) during etching to minimize spacer pulldown on the gate stack. In an alternative embodiment, entire spacers 406 may be pulled down.

In block 1112, fabrication system 107 deposits a non-conformal dielectric liner 520 to cover gates 402, spacers 406, trench contacts (TS) 506, S/D contacts 510, and gate contact 516. In a particular embodiment, dielectric liner 520 is formed of silicon nitride (SiN). During deposition of dielectric liner 520, the dielectric material of dielectric liner 520 pinches off the gap between gate 402 and trench contact (TS) 506 to form an air spacer 522 between trench contact (TS) 506 and gate 402 over original spacer 518. During the deposition process, dielectric liner 520 is also deposited upon the top of gate 402 to function as a gate cap.

In block 1114, fabrication system 107 fills gaps in the semiconductor structure with a dielectric material 524, such as a flowable oxide or low-k dielectric material, over dielectric liner 520 to the top of the dielectric liner 520 upon S/D contacts (CA) 510. In block 1116, fabrication system 107 further planarizes the dielectric material 524 to polish the surface of dielectric material 524. As a result an transistor structure having a robust air spacer is fabricated and ready for back end of line (BEOL) operations in which individual transistors are interconnected with wiring to produce a completed semiconductor device. The fabrication system 107 ends process 1100 thereafter.

Thus, a computer implemented method is provided in the illustrative embodiments for fabricating transistors having robust air spacers in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of fabricating a transistor comprising:
receiving a semiconductor structure, the semiconductor structure including a source/drain, a gate, and a spacer disposed between the source/drain and the gate, the semiconductor structure further including a trench contact disposed on the source/drain and a self-aligned cap disposed on the gate, the semiconductor structure further including an interlevel dielectric layer disposed on the spacer, self-aligned cap, and trench contact;
forming a source/drain contact within the interlevel dielectric layer in contact with the trench contact;
forming a gate contact within the interlevel dielectric layer in contact with the gate;
removing the interlevel dielectric layer from the spacer, self-aligned cap, and source/drain contact;
selectively etching the self-aligned cap and the spacer; and
depositing a dielectric liner of a first dielectric material upon a top of the gate, the trench contact and the S/D contact, the first dielectric material of the dielectric liner pinching off a gap between the gate and the trench contact to form an air spacer therebetween.

2. The method of claim 1, further comprising:
depositing a second dielectric material upon the dielectric liner.

3. The method of claim 2, wherein the second dielectric material includes an oxide.

4. The method of claim 2, wherein the second dielectric material includes a low dielectric constant (low-K) material.

5. The method of claim 1, wherein the selective etching of the self-aligned cap includes substantially removing the self-aligned cap.

6. The method of claim 1, wherein the selective etching of the spacer includes removing a portion of the spacer.

7. The method of claim 1, wherein the first dielectric material includes a non-conformal dielectric material.

8. The method of claim 1, wherein the first dielectric material includes silicon nitride.

9. The method of claim 1, wherein forming the source/drain contact within the interlevel dielectric layer further includes forming a contact trench in the interlevel dielectric layer and depositing a conductive material in the contract trench.

10. The method of claim 1, further comprising planarizing the source/drain contract.

11. The method of claim 1, wherein removing the interlevel dielectric layer includes etching the interlevel dielectric layer.

12. The method of claim 11, wherein etching the interlevel dielectric layer includes a wet etching process.

13. An apparatus comprising:
a source/drain;
a gate;
a trench contact disposed on the source/drain;
a source/drain contact in contact with the trench contact;
a gate contact in contact with the gate;
a dielectric liner of a first dielectric material deposited upon a top of the gate, the trench contact and the S/D contact, the first dielectric material of the dielectric liner forming an air spacer between the gate and the trench contact.

14. The apparatus of claim 13, wherein the first dielectric material includes a non-conformal dielectric material.

15. The apparatus of claim 13, wherein the first dielectric material includes silicon nitride.

16. The apparatus of claim 13, further comprising:
a second dielectric material deposited upon the dielectric liner.

17. The apparatus of claim 16, wherein the second dielectric material includes an oxide.

18. The apparatus of claim 16, wherein the second dielectric material includes a low dielectric constant (low-K) material.

19. A computer usable program product comprising one or more computer-readable storage devices, and program instructions stored on at least one of the one or more storage devices, the stored program instructions comprising:
program instructions to receive a semiconductor structure, the semiconductor structure including a source/drain, a gate, and a spacer disposed between the source/drain and the gate, the semiconductor structure further including a trench contact disposed on the source/drain and a self-aligned cap disposed on the gate, the semiconductor structure further including an interlevel dielectric layer disposed on the spacer, self-aligned cap, and trench contact;
program instructions to form a source/drain contact within the interlevel dielectric layer in contact with the trench contact;
program instructions to form a gate contact within the interlevel dielectric layer in contact with the gate;
program instructions to remove the interlevel dielectric layer from the spacer, self-aligned cap, and source/drain contact;
program instructions to selectively etch the self-aligned cap and the spacer; and
program instructions to deposit a dielectric liner of a first dielectric material upon a top of the gate, the trench contact and the S/D contact, the first dielectric material of the dielectric liner pinching off a gap between the gate and the trench contact to form an air spacer therebetween.

20. The computer usable program product of claim 19, the stored program instructions further comprising:
program instructions to deposit a second dielectric material upon the dielectric liner.

* * * * *